United States Patent [19]

Ho et al.

[11] Patent Number: 5,402,390

[45] Date of Patent: Mar. 28, 1995

[54] FUSE SELECTABLE TIMING SIGNALS FOR INTERNAL SIGNAL GENERATORS

[75] Inventors: Duc Ho, Houston; Duy-Loan T. Le, Missouri City; Kenneth A. Poteet; Scott E. Smith, both of Sugarland, all of Tex.

[73] Assignee: Texas Instruments Inc., Dallas, Tex.

[21] Appl. No.: 130,977

[22] Filed: Oct. 4, 1993

[51] Int. Cl.6 .................................................. G11C 7/00
[52] U.S. Cl. ............................. 365/225.7; 365/201; 365/233; 327/525; 327/44
[58] Field of Search .................... 365/201, 222, 225.7, 365/228, 233; 307/202.2, 522

[56] References Cited

U.S. PATENT DOCUMENTS

4,908,525  3/1990  Yung .............................. 307/202.1

Primary Examiner—Eugene R. LaRoche
Assistant Examiner—F. Niranjan
Attorney, Agent, or Firm—William W. Holloway; Lawrence J. Bassuk; Richard L. Donaldson

[57] ABSTRACT

Switching circuits controlled by a fuse that can be blown after testing the DRAM part select the timing signals coupled from a binary counter to internal signal generator circuits. The internal Circuits control self refresh in this embodiment. The decision to leave the fuse intact or blow the fuse rests on the test results obtained from each part and can vary depending upon maturity of the manufacturing process, the pause test results obtained and whether a low power part is desired. The fuse is affected after fabrication of the chip and at the same time as other fuses used for redundancy. This provides another degree of freedom in the manufacture of integrated circuits.

18 Claims, 6 Drawing Sheets

FUSE SELECTABLE TIMING SIGNALS FOR INTERNAL SIGNAL GENERATORS

FIELD OF THE INVENTION

This invention relates generally to a dynamic random access memory (DRAM) part having internal signal generator circuits that generate internal signals at desired times, and particularly relates to such a part that has switch circuits, including a fuse, for selecting certain timing signals to be applied to the internal signal generator circuits.

Description of the Related Art

Present DRAM parts have 16,772,216 or 16M addressable storage locations and come available in several versions. Different versions provide access to the memory array in words of different size, such as 1-, 4-, 8- and 16-bits per address; some of these versions operate under different power requirements, such as standard and low power. Low power parts are desirable because the systems and computers that use them use less power and, as a result, need smaller power supplies and smaller cooling capabilities DRAM parts generally include redundant rows and columns of memory cells to replace defective or marginal memory cells and improve yield; these redundancy circuits become selected after testing of the fabricated part determines the locations of the undesired cells. Selection of the redundant cells occurs by a laser blowing fuses formed in the chip to open or make desired connections.

These 16M bit Dram parts include circuits to effect self refresh. The self refresh circuits operate in a desired mode, described in U.S. Pat. Nos. 4,207,618, 4,293,932 4,333,167 and 4,344,157, for example, to cause refreshing of the dynamic memory cells without the need for the part to receive external row address signals. The self refresh circuits operate in conjunction with internal signal generator circuits that produce internal signals at desired times. The desired times are determined from a clock signal, produced by an oscillator, driving timing circuits such as a binary counter. The binary count produced by the counter becomes decoded by the internal signal generator circuits to produce the internal signals at the desired times. The internal signals in this particular case are used to operate certain circuits, such as internal RAS_ and wakeup, necessary to effect self refresh. Slowing down the self refresh feature on each chip to the slowest refresh rate that insures correct refresh of the fastest decaying bit of information in the array uses the least amount of power and obtains a lower power part. Thus slowing down the circuits necessary to effect self refresh results in a lower power part.

Variations in the processing of these 16M bit Dram parts occur during the normal development of the manufacturing procedures. The frequency of the clock signals produced by the oscillator on different parts can vary due to these process variations. Differences can also occur between the clock signal frequencies predicted by in computer simulation and the actual clock signal frequencies of the manufactured silicon chips, due to these process variations.

Some of these variations previously have been corrected for by metal options that select different clock signal frequencies as the process matures. Metal options, however, require costly and time consuming changes to the masks or reticles used to form the metal layers in the chip and the metal options cannot be changed from chip to chip to compensate for variations in the clock frequencies or required refresh times among different chips.

SUMMARY OF THE INVENTION

The present claimed invention provides a fuse and switching circuits for selecting between timing signals to be coupled between the timing circuits and the internal signal generator circuits on a Dram part. The manufacturing process includes laser blowing or leaving the fuse intact depending on the results of testing. This provides a way to compensate for variations in clock signal frequencies occurring among different parts after testing each part. By selecting the timing signals to slow the operation of the self refresh feature, higher yields for low power parts are achieved.

The part includes oscillator circuits producing a clock signal to drive timing circuits, or a binary counter, that produce timing signals, or a binary count. The internal signal generator circuits produce the internal signals in response to or by decoding certain timing signals. Switch circuits couple selected timing signals from the timing circuits to the internal signal generator circuits in response to a fuse being open.

Affecting the fuse, by leaving the fuse intact or blowing the fuse, occurs after fabricating the part and testing the memory cells. The testing can include a pause test to determine the length of time that the memory cells can hold their charge without refresh. Depending on the cells that pass the pause test and the frequency of the clock signal from the oscillator, the fuse can be left intact or blown.

DESCRIPTION OF THE PREFERRED EMBODIMENT

The present invention is used in a family of DRAM devices constructed and arranged to furnish one million words of sixteen parallel bits, also identified by the symbol 1M×16.

Figure 1:
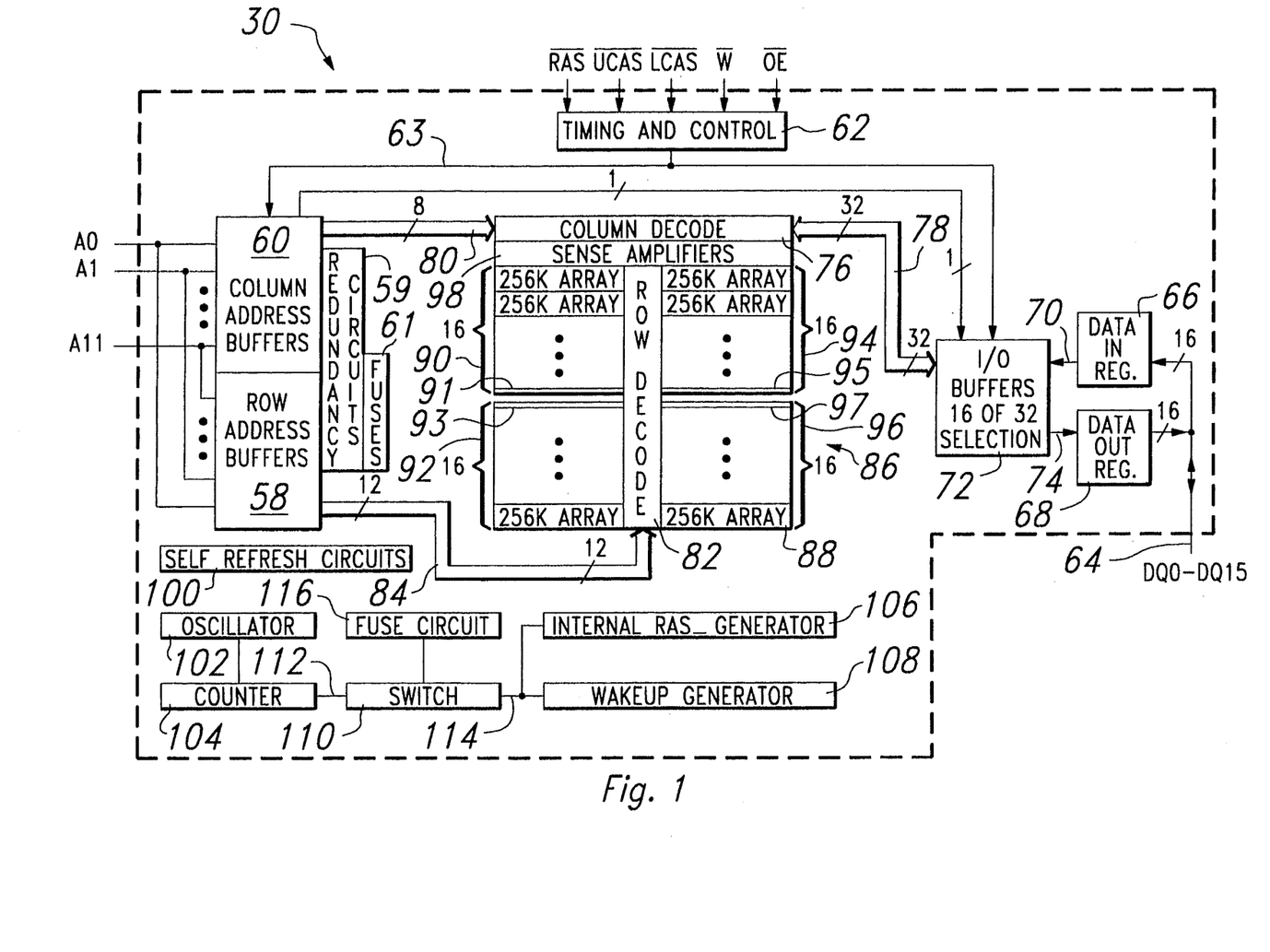
FIG. 1 is an idealized block diagram of a dynamic random access memory part including the fuse selectable timing signals of the present invention.

In FIG. 1, DRAM part 30 receives address signals A0–A11 in row address buffers 58 and column address buffers 60. The address signals become latched in the address buffers by use of control signals: Row Address Strobe, RAS_, Upper Column Address Strobe, UCAS_, Lower Column Address Strobe, LCAS_, Write, W_ and Output Enable, OE_, received in timing and control block 62. Leads 63 carry desired timing and control signals from block 62 to buffers 58 and 60.

Redundancy circuits 59 and fuse circuits 61 connect with the address information received in row and column buffers 58 and 60 to select redundant rows and columns of memory cells for replacing defective memory cells. The determination of fuses to be blown and left alone to select redundant memory cells occurs after testing. The part is fabricated and then tested; repairable parts are acted upon by such as a laser that blows appropriate fuses in fuse circuits 61 and selects redundant rows and columns of memory cells to produce a saleable part.

Data signals DQ0–DQ15 are carried in parallel on leads 64 to data in register 66 and data out register 68. Sixteen data signals in parallel pass across leads 70 from data in register 66 to the 16 I/O buffers 72 and 16 data signals in parallel pass across data leads 74 from the 16 I/O buffers 72 to the data out register 68. Sixteen data signals in parallel pass from the I/O buffers 72 to the column decoders 76 across leads 78. The I/O buffers 72 also receive timing and control signals over leads 63 from timing and control block 62. Column decoders 76 receive 8 address signals in parallel across leads 80 from column address buffers 60. Row decoders 82 receive 12 address signals in parallel over leads 84 from row address buffers 58.

Column decoders 76 and row decoders 82 address individual memory cells in array 86, which includes 16,777,216 data bits configured in 1,048,576 (1M) words by 16 bits per word. Array 86 contains 64 subarrays, such as subarray 88, with each subarray containing 256K of data bits. Array 86 arranges the subarrays in four quadrants 90, 92, 94, and 96, with 16 subarrays in each quadrant. Each of the subarrays contain redundant memory cells arranged as redundant rows and redundant columns; these redundant memory cells are schematically represented at blocks 91, 93, 95, and 97. The redundant rows become selected by the row address signals received over leads 84 and the redundant columns become selected by the column address signals received over leads 80.

FIG. 1 depicts the subarrays in an idealized way between row decoders 82 and sense amplifiers 98. In the actual part, the row decoders can be arranged between the quadrants and the sense amplifiers can be located between the subarrays. The data signals from the selected rows of data bits in the array parts pass through the sense amplifiers 98 to column decoders 76.

Control signals Write, W__, and Output enable, OE__, connect to timing and control block 62 to indicate and control the writing and reading of data signals from overall array 86.

Please understand that this text uses an underline character following the name or acronym for a signal to indicate the active low state. This facilitated text preparation using a word processor, even though the drawing may use an overscore to indicate the active low state.

DRAM part 30 also includes many other peripheral circuits to facilitate reading, writing and storage of data or information in part 30. Some of these circuits include self refresh circuits 100. The self refresh circuits 100 operate in a desired mode, described in the previously cited U.S. patents, to cause refreshing of the dynamic memory cells without the need for the part to receive external row address signals. Oscillator circuits 102 operate at a selected frequency to operate the counter circuits 104 and the internal RAS__ generator circuits 106 and the wakeup generator circuits 108. Switch circuits 110 couple timing signals on leads 112 and 114 between counter circuits 104 and the signal generator circuits 106 and 108. Fuse circuits 116 connect to and control operation of the switch circuits 110.

Figure 2:
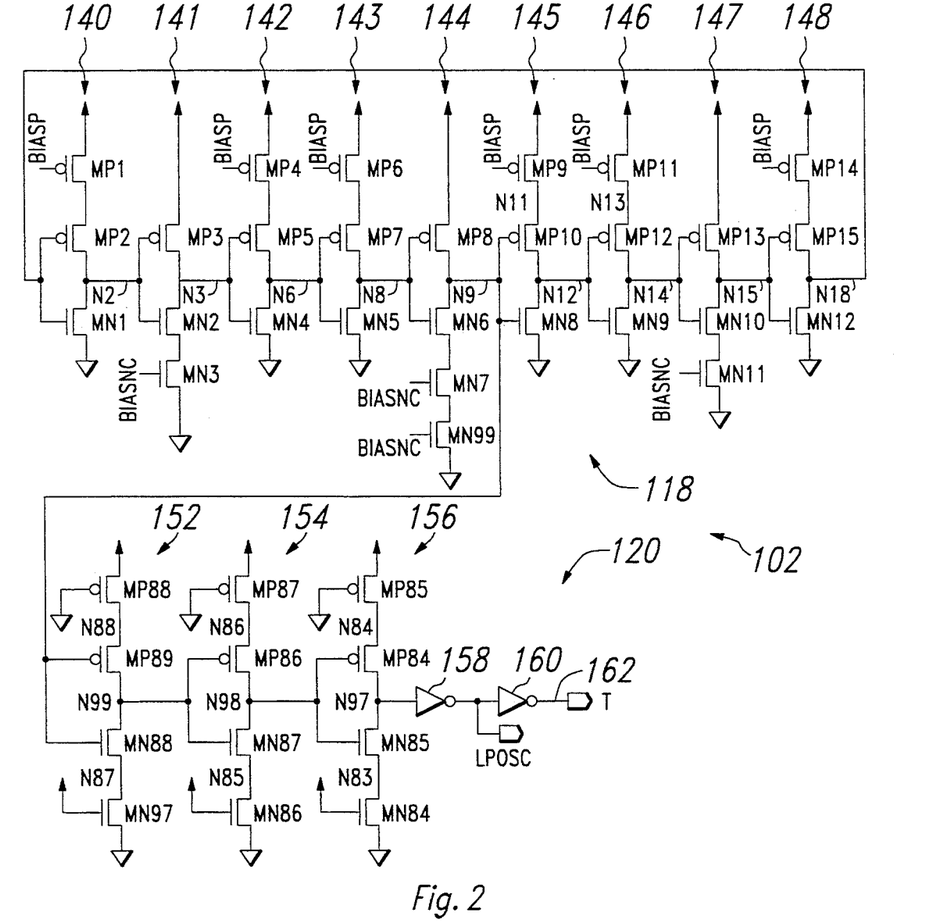
FIG. 2 is a schematic diagram of an oscillator used with the present invention.

In FIG. 2, oscillator 102 includes an inverter ring 118 and an output stage 120. Inverter ring 118 comprises 9 inverter stages 140–148 having their inputs and outputs connected together in a loop. Output stage 120 receives the output of inverter ring 118 from between stages 144 and 145 and produces a clock signal T at lead 162. Inverter ring 118 receives bias voltages BIASP and BIASNC to control the frequency at which oscillator operates. These bias voltages and the circuits that produce them are disclosed in U.S. patent application 08/131,067 entitled PROCESS OF MAKING A DRAM STANDBY CHARGE PUMP WITH OSCILLATOR HAVING FUSE SELECTABLE FREQUENCIES, filed Oct. 4, 1993 in the names of Scott E. Smith, Duy-Loan Le, Kenneth A. Poteet, and Duc Po, and assigned to the assignee of the present invention and are unnecessary for disclosure of the present invention.

Inverter stage 140 comprises transistors mp1, mp2 and mn1 connected in series between Vdd and Vss. The gate of transistor mp1 receives the bias voltage BIASP. The gates of transistors mp2 and mn1 receive the output of inverter stage 148 on node n18.

Inverter stage 141 comprises transistors mp3, mn2 and mn3 connected in series between Vdd and Vss. The gate of transistor mn3 receives the bias voltage BIASNC. The gates of transistors mp3 and mn2 receive the output of inverter stage 140 on node n2.

Inverter stage 142 comprises transistors mp4, mp5 and mn4 connected in series between Vdd and Vss. The gate of transistor mp4 receives the bias voltage BIASP. The gates of transistors mp5 and mn4 receive the output of inverter stage 141 on node n3.

Inverter stage 143 comprises transistors mp6, mp7 and mn5 connected in series between Vdd and Vss. The gate of transistor mp6 receives the bias voltage BIASP. The gates of transistors mp7 and mn5 receive the output of inverter stage 142 on node n6.

Inverter stage 144 comprises transistors mp8, mn6, mn7 and mn99 connected in series between Vdd and Vss. The gates of transistors of mn7 and mm99 connect to the bias voltage BIASNC. The gates of transistors mp8 and mn6 connect to the output of inverter stage 143 on node n8.

Inverter stage 145 comprises transistors mp9, mp10 and mn8 connected in series between Vdd and Vss. The gate of transistor mp9 receives bias voltage BIASP. The gates of transistors mp10 and mn8 receive the output of inverter stage 144 on node n9.

Inverter stage 146 comprises transistors mp11, mp12 and mn9 connected in series between Vdd and Vss. The gate of transistor mp11 receives bias voltage BIASP. The gates of transistors mp12 and mn9 receive the output of inverter stage 145 on node n12.

Inverter stage 147 comprises transistors mp13, mn10 and mn11 connected in series between Vdd and Vss. The gate of transistor mn11 receives the bias voltage BIASNC. The gates of transistors mp13 and mn10 receive the output of inverter stage 146 on node n14.

Inverter stage 148 comprises transistors mp14, mp15 and mn12 connected in series between Vdd and Vss. The gate of transistor mp14 receives the bias voltage BIASP. The gates of transistors mp15 and mn12 receive the output of inverter stage 147 on node n15.

The output of inverter ring 118 occurs at node n9 and extends through 3 inverter stages 152, 154 and 156 and 2 inverters 158 and 160 to appear on lead 162.

Inverter stage 152 comprises transistors mp88, mp89, mn88 and mn97 connected in series between Vdd and Vss. The gate of transistor mp88 connects to Vss. The gate of transistor mn97 connects to Vdd. The gates of transistors mp89 and mn88 connect to node n9.

Inverter stage 154 comprises transistors mp87, mp86, mn87 and mn86 connected in series between Vdd and Vss. The gate of transistor mp87 connects to Vss. The gate of transistor mn86 connects to Vdd. The gates of transistors mp86 and mn87 connect to the output of inverter stage 152 on node n99.

Inverter stage 156 comprises transistors mp85, mp84, mn85 and mn84 connected in series between Vdd and Vss. The gate of transistor mp85 connects to Vss. The gate of transistor mn84 connects to Vdd. The gates of transistors mp84 and mn85 connect together and to the output of inverter stage 154 on node n98.

The input of inverter 158 occurs at the output of inverter stage 156 on node n97. The output of inverter 158 proceeds to the input of inverter 160. The output of inverter 160 occurs on lead 162 as clock signal T.

In operation the inverter ring 112 is a special low power oscillator that uses reference voltages BIASP and BIASNC. The voltage BIASP is about one threshold voltage of a P-channel transistor below Vdd and the voltage BIASNC is about one threshold voltage of an N-channel transistor over Vss. The pair of voltages BIASP and BIASNC form a set of bias voltages. These two voltages or the set of bias voltages are used in the inverter chain of the oscillator to control switching current. Control of the switching current in each stage controls the delay through each inverter stage. The operating frequency of the inverter ring can be changed by adjusting the level of the reference voltages. Depending upon the voltages of BIASP and BIASNC, the inverter ring can oscillate at periods of about 1 or 2 microseconds.

As in all inverter ring oscillators, a high to low transition at the output of any inverter stage propagates through all of the succeeding inverted stages in inverted form to appear back at the input of that first inverter stage as a high to low transition. This causes the rippling of high to low and low to high transitions through the inverter ring or ring of inverters at a speed governed by the time it takes each inverter stage to pass the transition received at its input to its output. Controlling the currents through each inverter stage with the voltages BIASP and BIASNC thus controls the frequency at which the inverter ring or ring of inverters oscillates.

Because the ring of inverters 118 operates at a relatively slow frequency such as having a period of 1 or 2 microseconds, the rise and fall times through the stages are slower than desired for operating the other circuits. Output stage 120, comprising inverter stages 152, 154 and 156, shapes the transitions received from the inverter ring 118 and provide voltage swings closer to Vdd and Vss.

Figure 3:
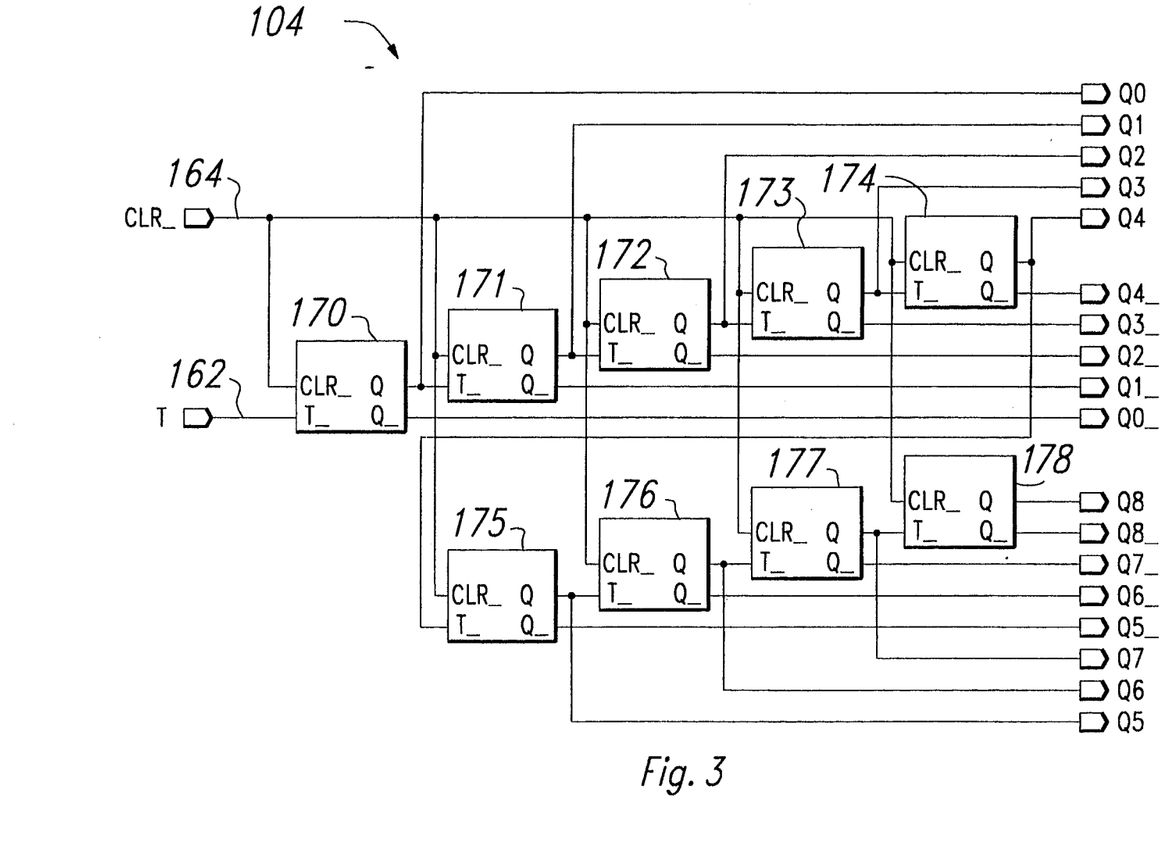
FIG. 3 is block diagram of a timing circuit or binary counter used with the present invention.

In FIG. 3, counter 104 comprises 9 flip-flops 170–178. Each flip-flop has a clock input T_ and a clear input CLR_. Each flip-flop also has a Q and a Q_ output. The first flip-flop 170 receives its clock signal input T_ from the clock signal T output of oscillator 102 on lead 162. Thereafter, the Q output of each flip-flop drives the clock signal input T_ of the next flip-flop.

The Q output of each flip-flop also becomes the true state of binary counts Q0–Q8. The Q_ outputs of each flip-flop respectively become the inverted binary counts Q0_–Q8_.

The clear signal CLR_ on lead 164 connects to the clear input CLR_ of each flip-flop 170–178. An active low CLR_ signal sets each flip-flop to its zero state and resets the binary count produced by all of the flip-flops to a zero state. Thereafter, application of the clock signal T on lead 162 causes the binary Count carried on output leads Q0–Q8 and Q0_–Q8_ to increment one binary count for each-cycle of the clock signal T.

Figure 4:
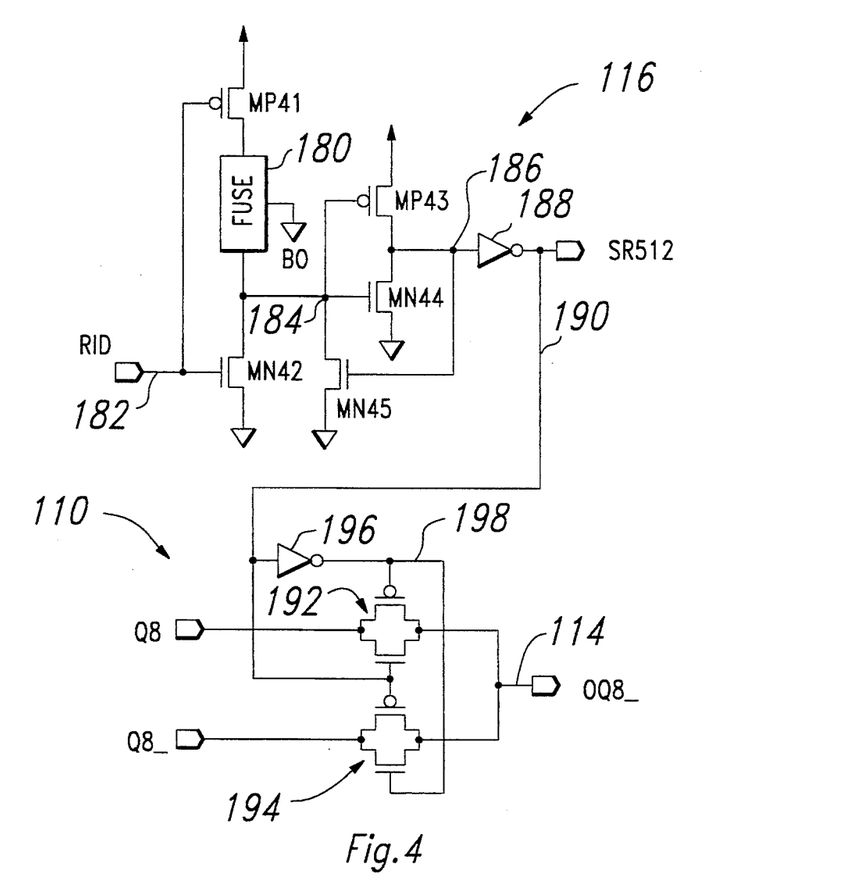
FIG. 4 is a schematic diagram of a fuse circuit and a switch circuit of the present invention.

In FIG. 4, fuse circuit 116 comprises a series connection of transistors mp41, fuse 180 and transistor mn42 between Vdd and Vss. Transistors mp43 and mn44 also extend between Vdd and Vss. The signal RID on lead 182 extends to the gates of transistors mp41 and mn42. Node 184 extends between fuse 180, transistor mn42 and the gates of transistors mp43 and mn44. Transistor mn45 extends between node 184 and Vss. The output of fuse circuit 116 extends from between transistors mp43 and mn43 on lead 186 and extends to the gate of transistor mn45. Lead 186 forms the input to inverter 188 and the output of inverter 188 forms signal SR512 on lead 190 and the output of the fuse circuit 116.

Fuse circuit 116 controls switch circuits 110 and contains one fuse 180. The state of the fuse circuit 116 becomes set at power-up when RID is high. If the fuse is blown, then the signal RID high will force node 184 low forcing the output on lead 186 high. The keeper transistor mn45 maintains node 184 low due to the output signal on lead 186 being high.

If the fuse is not blown, then lead 184 will charge back up to Vcc after the signal RID goes low. This will force the output on lead 186 to a low state.

Fuse 180 can be formed as desired in either a blow-to-make or a blow-to-open configuration. In this embodiment, fuse 180 is formed of polysilicon material that is acted on by a laser beam to open a circuit.

Switch circuits 110 comprise two pairs of pass transistors 192 and 194. Each pair of transistors includes an N-channel transistor and a P-channel transistor connected in parallel. Pair of transistors 192 connects to the binary count Q8 received from counter circuits 104. Pair of transistors 194 connects to the binary count Q8_ received from counter circuits 104. The other side of both pairs of transistors 192 and 194 connect to the binary count signal OQ8_ on lead 114 to be passed to the internal RAS_ generator circuits 106 and the wakeup generator circuits 108. Inverter 196 receives the signal SR512 on lead 190 from the fuse circuits 116 and forms an inverted signal on lead 198. The gate of the N-channel transistor in pair 192 and the gate of the P-channel transistor in pair 194 connect to the signal SR512 of lead 190. The gate of P-channel transistor in pair 192 and the gate of N-channel transistor in pair 194 connect to the lead 198. Thus depending upon the state of fuse 180, switch circuits 110 pass the binary count signal Q8 or Q8_ to the output OQ8_ on lead 114.

With the fuse intact, the self refresh circuits operate at 512 microsecond intervals. With the fuse blown, the self refresh circuits operate at intervals of 256 microseconds. When the fuse circuits are set in the 512 microsecond interval, the switch circuits allow the signal Q8 to pass to the output OQ8_. When the fuse circuits are set for the 256 microsecond intervals, the switch circuits allow the Q8_ signal to pass to the OQ8_ signal.

Figure 5:
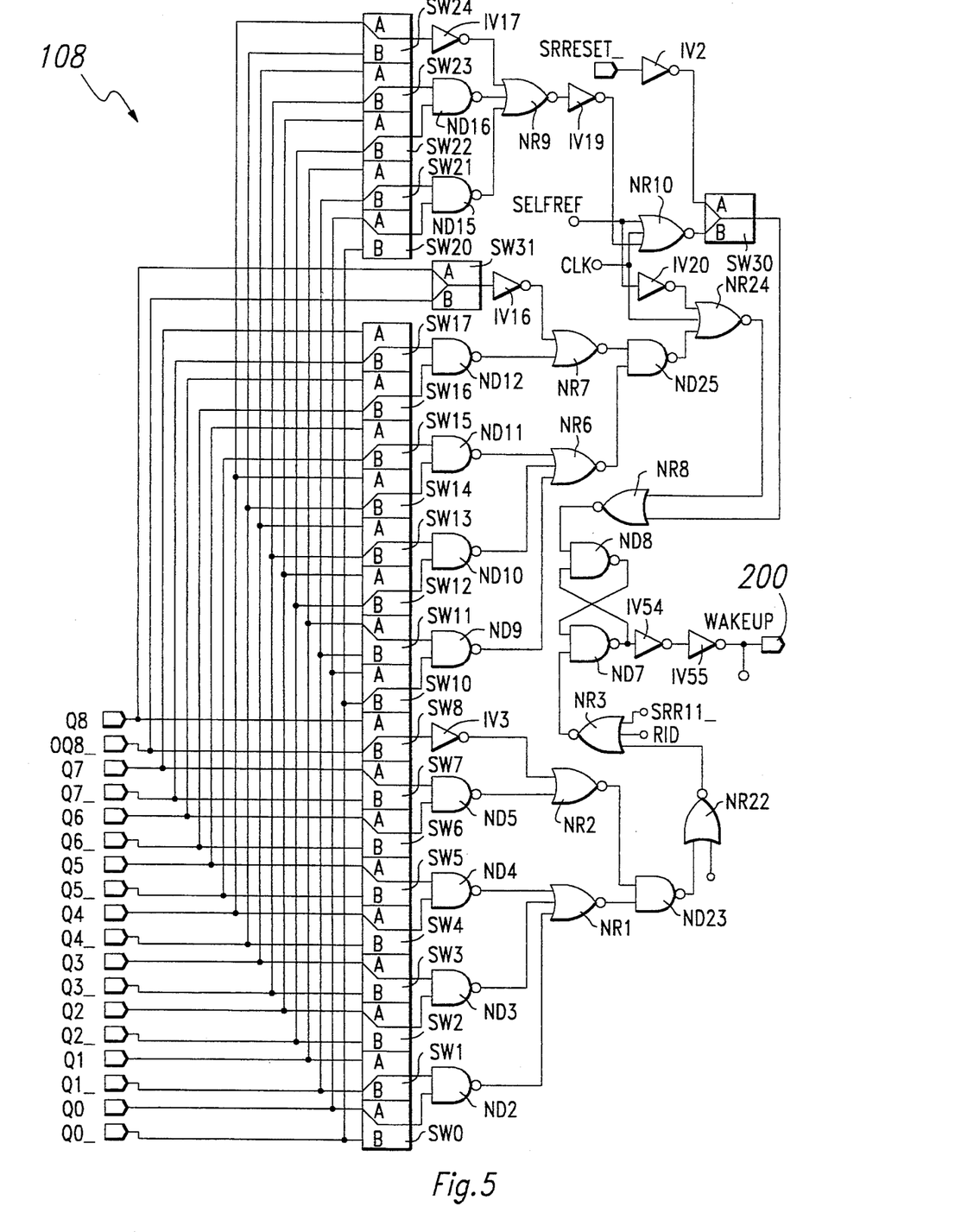
FIG. 5 is a schematic diagram of a wakeup generator circuit.

In FIG. 5, wakeup generator circuits 108 include switches SW0–SW8, SW10–SW17 and SW20–SW24 respectively receiving binary count signals Q0, Q0_ through Q8, OQ8_. Switch SW31 additionally receives binary count signals Q8 and OQ8_. Wakeup generator circuits 108 produce a signal WAKEUP on lead 200 at certain times depending upon the decoding options provided by the named switches.

Each switch is a metal option formed during fabrication of the chip to connect a selected binary count signal to the input of a logic gate to perform desired time sequence decoding. By producing the binary counts at a certain frequency from a time defined by the clear signal CLR—, the wakeup generator circuits 108 can produce the signal WAKEUP on lead 200 with desired timed precision by simply decoding the count on the binary count signals. By letting the binary count received on signal 0Q8— be determined by fuse circuit 116 and switch circuit 110, the timing of wakeup signal 200 can be changed after fabricating the part and after testing at the time of acting on other fuses used for redundancy.

In particular switches SW0 and SW1 connect to the inputs of NAND gate nd2. Switches SW2 and SW3 connect to the inputs of NAND gate nd3. Switches SW4 and SW5 connect to the inputs of NAND gate nd4. Switches SW6 and SW7 connect to the inputs of NAND gate nd5. Switch SW8 connects to the input of inverter iv3. The outputs of NAND gates nd2, nd3 and nd4 connect to the inputs of NOR gate nr1. The output of NAND gate nd5 and the output of inverter iv3 connect to the input of NOR gate nr2. The outputs of NOR gates nr1 and nr2 connect to the inputs of NAND gate nd23. The output of NAND gate nd23 and a clock signal CLK go to the inputs of NOR gate nr22. The output of NOR gate nr22 and the signals RID and SRRL1— go to the inputs of NOR gate nr3. The output of NOR gate nr3 goes to the input of NAND gate nd7, which is connected with NAND gate nd8 in a set-reset latch. The output of NOR gate nr3 forms the set input of the latch nd7 and nd8. The output of NAND gate nd7 goes to the input of inverter iv54 and one input of NAND gate nd8. The output of inverter iv54 goes to the input of inverter iv55 and the output of iv55 forms the wakeup signal on lead 200.

Switches SW10 and SW11 connect to the inputs of NAND gate nd9. Switches SW12 and SW13 connect to the inputs of NAND gate nd10. Switches SW14 and SW15 connect to the inputs of NAND gate nd11. Switches SW16 and SW17 connect to the inputs of NAND gate nd12. Switch SW31 connects to the input of inverter 16. The outputs of NAND gates nd9, nd10 and nd11 go to the inputs of NOR gate nr6. The outputs of NAND gate nd12 and inverter iv16 go to the inputs of NOR gate nr7. The outputs of NOR gates nr6 and nr7 go to the inputs of NAND gate nd25.

Switches 20 and 21 connect to the inputs of NAND gate nd15. Switches 22 and 23 connect to the inputs of NAND gate nd16 and switch 24 connects to the input of inverter iv17. The outputs of NAND gates nd15 and nd16 and inverter iv17 connect to the inputs of NOR gate nr9. The output of NOR gate nr9 goes through inverter iv19 to one of the inputs to NOR gate nr10. A self refresh signal goes to one of the inputs of NOR gate nr10 and through inverter iv20 to one of the inputs to NOR gate nr24. The clock signal CLK goes to one of the inputs of NOR gate nr10 and nr24. The output of NAND gate nd25 goes to one of the inputs to NOR gate nr24. A signal SRRESET— passes through inverter iv2 to switch SW30. Switch SW30 connects the output of NOR gate nr10 to one of the inputs to NOR gate nr8. The output of NOR gate nr24 goes to the other input to NOR gate nr8. The output of NOR gate nr8 goes to one of the inputs to NAND gate nd8 to reset the latch of nd7 and nd8. The output from NAND gate nd8 goes to one of the inputs to NAND gate nd7 to form the latch.

The function of the wakeup generator circuits is to generate the signal WAKEUP to disable certain circuits during self refresh. The wakeup signal will become low about 12 microseconds after the chip enters the CBR cycle with the indicated switch options. This is equivalent to a binary count of about 17. The wakeup signal will remain low and will go high about 2 microseconds before the internal RAS— signal IRAS— is generated at count 512. The signal wakeup going high occurs at a count of 510. The signal IRAS— going low will reset the frequency counter and 2 microseconds after the rising edge of the IRAS— signal, equivalent to 2 counts, the signal WAKEUP drops low. The latch for the WAKEUP signal is reset with the signal SRRL1— going low. Similar to other self refresh circuits, the clock signal CLK is used for synchronizing purposes. The metal option at switch SW30 for SRRESET is used to force WAKEUP low at the same time that SELFREF goes high. This option provides more flexibility to enter the self refresh mode at 10 microseconds after entering the CBR cycle. If not desired, the wakeup generator circuits use the number of counts to drop the WAKEUP signal low at 10 microseconds during the 32 microseconds self refresh entry.

Figure 6:
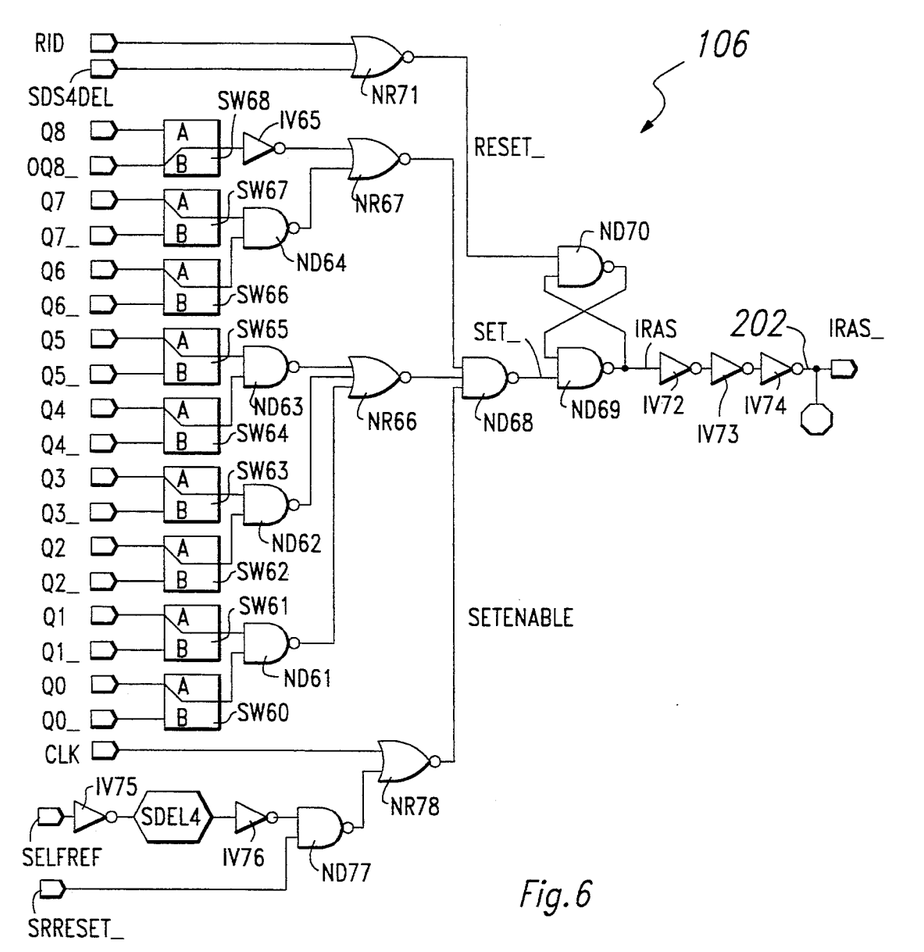
FIG. 6 is a schematic diagram of an internal RAS generator circuit.

In FIG. 6, the internal RAS— generator circuits 106 includes switches SW60 through SW68 respectively connected to binary count signals Q0—, Q0 through 0Q8—, Q8. Switches SW60 and SW61 connect to the inputs of NAND gate nd61. Switches SW62 and SW63 connect to the inputs of NAND gate nd62. Switches SW64 and SW65 connect to the inputs of NAND gate nd63. Switches SW66 and SW67 connect to the inputs of NAND gate nd64. Switch SW68 connects to the input of inverter iv65. The outputs of NAND gates nd61, nd62 and nd63 connect to the inputs of NOR gate nr66. The output of NAND gate nd64 and inverter iv65 connect to the inputs of NOR gate nr67. The outputs of NOR gate nr66 and NOR gate nr67 connect to the inputs of NAND gate nd68. The output of NAND gate nd68 goes to the SET— input of the latch formed by NAND gates nd69 and nd70. The output of NAND gate nd69 goes to one of the inputs of NAND gate nd70 and through inverters iv72, iv73 and iv74 to produce the signal IRAS— on lead 202.

The signals RID for power-up and SDS4DEL go to the inputs of NOR gate nr71. The output of NOR gate nr71 goes the RESET— input of NAND gate nd70. The output of NAND gate nd70 goes to the other input of NAND gate nd69. The signal SELFREF passes through inverter iv75, time delay SDEL4 and inverter iv76 to one of the inputs of NAND gate nd77. The signal SRRESET— goes to the other input of NAND gate nd77. The output of NAND gate nd77 goes to the input of NOR gate nr78. A clock signal CLK goes to the other input of NOR gate nr78. The output of NOR gate 78 goes to one of the inputs to NAND gate nd68 and forms the signal SETENABLE. When the signal SELFREF is low, the counts Q0–Q8 and their compliments are ignored. At this time SDS4DEL is high so that the latch formed by NAND gates nd69 and nd70 is reset forcing the signal IRAS— high.

When the signal SELFREF is high and the signal SDS4DEL is low, the signal IRAS— is generated at 512 counts. It will stay low until SDS4DEL becomes high to reset the latch. This low pulse width of IRAS— is presently set around 80 nanoseconds to guarantee that a refresh cycle, once started, will have time to complete and restore the data to the cell.

The lengths and widths of the transistors used in the disclosed circuits can be as desired while remaining within the scope of the claims. Typical and relative widths and lengths of the channels of the P and N type transistors used in the present embodiment follow.

In FIG. 2, stage 141 has transistors mp1 with a width of 5 and a length of 8, mp2 with a width of 5 and a length of 1 and mn1 with a width of 5 and a length of 3. Stage 141 has transistors mp3 with a width of 5 and a length of 3, mn2 with a width of 5 and a length of 1 and mn3 with a width of 5 and a length of 26. Stage 142 has transistors mp4 with a width of 10 and a length of 8, mp5 with a width of 5 and a length of 1 and mn4 with a width of 5 and a length of 3. Stage 144 has transistors mp8 with a width of 5 and length of 3, mn6 with a width of 5 and a length of 1, mn7 with a width of 10 and a length of 13 and mn99 with a width of 10 and a length of 13.

The disclosed embodiment can be modified and varied while remaining within the scope of the following claims. For example, the arrangement and sizes of the transistors can be modified while remaining within the scope of the claims. The particular implementation of the oscillator can change, and the decoding of the counter can change to produce internal signals at different times. Also, the switch and fuse circuits can be modified while obtaining the same result.

I claim:

1. A dynamic random access memory part comprising:
   an array of memory cells for storing one data bit in one data cell, the array of memory cells including redundant cells selected by fuses after testing of the part to replace defective memory cells;
   peripheral circuits for generating internal signals to operate the array of memory cells upon receipt of timing signals representing selected times;
   oscillator circuits for producing a clock signal, the clock signal occurring at a frequency that can vary from part to part;
   timing circuits receiving the clock signal and producing the timing signals;
   switch circuits coupling selected timing signals between the timing circuits and the peripheral circuits in response to receipt of a switch signal; and
   fuse circuits including a fuse and producing said switch signal in response to the fuse being open and closed.

2. The part of claim 1 in which the timing signals are binary weighted count signals.

3. The part of claim 1 in which the fuse circuit receives a power on reset signal conditioning the fuse circuit in a desired state.

4. The part of claim 1 in which the peripheral circuits include internal RAS_ generator circuits and wakeup generator circuits.

5. The part of claim 1 in which the fuse is opened to select alternate timing signals.

6. The part of claim 1 in which the timing signals are binary weighted count signals q0, q0_ through q8, q8_ and the switch circuits select between coupling q8 and q8_ to the peripheral circuits.

7. The part of claim 1 in which the timing signals are binary weighted count signals and the peripheral circuits include binary count decoders to generate the internal signals at certain times represented by the binary counts.

8. The part of claim 1 in which the timing circuits receive a clear signal to initiate the timing signals.

9. The part of claim 1 in which the peripheral circuits include metal option switches for selecting timing signals to generate the internal signals.

10. Switching circuits for a dynamic random access memory part that includes true and inverted binary count signals used for timing, the switching circuits comprising:
    pass circuits having a pair of inputs, which receive the true and inverted states of the same binary count, an output and two pairs of transistors, each pair of transistors being connected to one of the inputs, each pair of transistors including an N-channel transistor and a P-channel transistor connected in parallel, the gate of the N-channel transistor in one pair being connected to the gate of the P-channel transistor in the other pair, both pairs of transistors being connected to the output, the pass circuits including an inverter having an input connected to the gate of one N-channel transistor and having an output connected to the gate of the other N-channel transistor; and
    fuse circuits including a fuse and a latch, the fuse being connected in series between a pair of transistors and to the input to the latch, the output of the latch being connected to the input of the inverter in the pass circuits.

11. The switching circuits of claim 10 in which the fuse circuits receive a power on reset signal applied to the pair of transistors connected in series with the fuse.

12. The switching circuits of claim 10 in which opening the fuse selects an alternate binary count to be applied to the output of the pass circuits.

13. A process of making a dynamic random access memory part comprising:
    fabricating the part to include fuses for selecting redundant cells that replace defective cells and to include at least one fuse for selecting between certain timing circuits signals;
    testing the part to ascertain the location of defective cells and ascertain the frequency of timing circuits;
    affecting the fuses to select redundant cells for replacing the defective cells; and
    affecting the at least one fuse to select between the certain timing circuits signals.

14. The process of claim 13 in which affecting the at least one fuse to select the frequency of the timing circuits includes blowing a fuse.

15. The process of claim 13 including forming metal option switches to select the certain timing circuit signals.

16. A dynamic random access memory part comprising:
    an array of memory cells;
    peripheral circuits for generating internal signals to operate the array of memory cells in response to timing signals; and
    timing circuits for generating the timing signals, the timing circuits including a fuse, the fuse capable of being blown after fabrication of the part, wherein blowing of the fuse changes the timing circuits wherein at least one timing signal is altered by a predetermined amount.

17. A process for fabricating a dynamic random access memory part, the process comprising the steps of:

in a part in which timing signals are used to control operation of an array of storage cells, fabricating the a timing circuit in the part to include a fuse, wherein a state of the fuse determines a timing property of at least one timing signal, a state of the fuse capable of being changed after fabrication of the part.

18. The process of claim 17 further including the step of changing the state of the fuse after the part has been tested.

* * * * *